(12) United States Patent
Wang

(10) Patent No.: US 10,016,843 B2
(45) Date of Patent: Jul. 10, 2018

(54) SYSTEMS AND METHODS FOR REDUCING PULSED LASER BEAM PROFILE NON-UNIFORMITIES FOR LASER ANNEALING

(71) Applicant: Ultratech, Inc., San Jose, CA (US)

(72) Inventor: Yun Wang, Saratoga, CA (US)

(73) Assignee: Ultratech, Inc., San Jose, CA (US)

(*) Notice: Subject to any disclaimer, the term of this patent is extended or adjusted under 35 U.S.C. 154(b) by 116 days.

(21) Appl. No.: 15/064,634

(22) Filed: Mar. 9, 2016

(65) Prior Publication Data
US 2016/0276184 A1 Sep. 22, 2016

Related U.S. Application Data

(60) Provisional application No. 62/136,011, filed on Mar. 20, 2015.

(51) Int. Cl.
*H01S 3/00* (2006.01)
*H01L 21/268* (2006.01)
(Continued)

(52) U.S. Cl.
CPC ...... *B23K 26/0622* (2015.10); *B23K 26/0006* (2013.01); *B23K 26/0066* (2013.01);
(Continued)

(58) Field of Classification Search
CPC ................. H01L 21/324; H01L 21/268; H01L 21/67115; H01L 21/76894; H01L 23/5258;
(Continued)

(56) References Cited

U.S. PATENT DOCUMENTS

| 4,970,546 A | 11/1990 | Suzuki et al. |
| 5,580,800 A * | 12/1996 | Zhang ............... H01L 21/02071 148/DIG. 51 |

(Continued)

FOREIGN PATENT DOCUMENTS

| JP | S5413553 A | 10/1979 |
| JP | 2006-049635 A | 2/2006 |
| JP | 2006-287183 A | 10/2006 |

OTHER PUBLICATIONS

English translation of Office Action dated Oct. 24, 2017 in related JP Patent Application No. 2016-056116.
(Continued)

*Primary Examiner* — Caridad Everhart
(74) *Attorney, Agent, or Firm* — Downs Rachlin Martin PLLC

(57) ABSTRACT

Systems and methods for reducing pulsed laser beam profile non-uniformities for laser annealing are disclosed. The methods include directing an initial pulsed laser beam along an optical axis, and imparting to each light pulse a time-varying angular deflection relative to the optical axis. This forms a new laser beam wherein each light pulse is smeared out over an amount of spatial deflection δ sufficient to reduce the micro-scale intensity variations in the laser beam. The new laser beam is then used to form the line image, which has better intensity uniformity as compared using the initial laser beam to form the line image.

21 Claims, 11 Drawing Sheets

(51) Int. Cl.
*H01L 21/324* (2006.01)
*H01L 21/67* (2006.01)
*B23K 26/06* (2014.01)
*B23K 26/0622* (2014.01)
*B23K 26/00* (2014.01)
*B23K 26/073* (2006.01)
*B23K 26/082* (2014.01)
*B23K 26/352* (2014.01)
*B23K 26/066* (2014.01)
*B23K 101/40* (2006.01)
*B23K 103/00* (2006.01)

(52) U.S. Cl.
CPC ........ *B23K 26/066* (2015.10); *B23K 26/0643* (2013.01); *B23K 26/0648* (2013.01); *B23K 26/0738* (2013.01); *B23K 26/082* (2015.10); *B23K 26/352* (2015.10); *H01L 21/268* (2013.01); *H01L 21/324* (2013.01); *B23K 2201/40* (2013.01); *B23K 2203/50* (2015.10); *B23K 2203/56* (2015.10); *H01S 3/0071* (2013.01); *H01S 3/0085* (2013.01)

(58) Field of Classification Search
CPC ............. H01S 3/0071; B23K 26/0622; B23K 26/0643; H91L 2924/0002
See application file for complete search history.

(56) References Cited

U.S. PATENT DOCUMENTS

| | | |
|---|---|---|
| 6,956,878 B1 | 10/2005 | Trisnadi |
| 7,326,623 B2 | 2/2008 | Hongo et al. |
| 7,817,685 B2 | 10/2010 | Osako et al. |
| 7,834,353 B2 | 11/2010 | Hongo et al. |
| 8,014,427 B1 | 9/2011 | Anikitchev |
| 8,026,519 B1 | 9/2011 | Anikitchev et al. |
| 8,208,506 B2 | 6/2012 | Osako et al. |
| 9,029,731 B2 | 5/2015 | Osako et al. |
| 2003/0068836 A1 | 4/2003 | Hongo et al. |
| 2003/0112322 A1 | 6/2003 | Tanaka |
| 2005/0169330 A1 | 8/2005 | Hongo et al. |
| 2005/0170569 A1 | 8/2005 | Yazaki et al. |
| 2008/0231940 A1 | 9/2008 | Imanishi |
| 2012/0250134 A1* | 10/2012 | Unrath ............... B23K 26/0613 359/239 |
| 2013/0201634 A1* | 8/2013 | Im ........................ C30B 1/08 361/748 |
| 2014/0063808 A1 | 3/2014 | Kajiyama et al. |

OTHER PUBLICATIONS

Search Report dated Jul. 19, 2016 by the Intellectual Property Office of Signapore for Singapore Patent Application No. 10201602088T, which is a counterpart application to the above-identified U.S. Patent Application.

Written Opinion dated Apr. 13, 2017 by the Intellectual Property Office of Signapore for Singapore Patent Application No. 10201602088T, which is a counterpart application to the above-identified U.S. Patent Application.

Office Action dated Feb. 24, 2017 for Japanese Patent Application No. 2016-056116, which is a counterpart application to the above-identified U.S. Patent Application.

* cited by examiner ns and methods for reducing pulsed laser beam profile non-uniformities for laser annealing

CROSS-REFERENCE TO RELATED APPLICATIONS

The application claims priority under 35 USC 119(e) from Provisional Patent Application Ser. No. 62/136,011, filed on 20 Mar. 2015, and which is incorporated by reference herein.

FIELD

The present disclosure relates to laser annealing, and in particular relates to systems and methods for reducing beam profile non-uniformities for laser annealing that uses a pulsed laser beam.

The entire disclosure of any publication or patent document mentioned herein is incorporated by reference, including U.S. Pat. Nos. 6,747,245; 7,098,155; 7,157,660; 7,763,828; 8,014,427; 8,026,519; 8,309,474; 8,501,638; 8,546,805; 8,691,598 and U.S Publication No. 2013/0330844.

BACKGROUND

Laser annealing (also called laser spike annealing, laser thermal annealing, laser thermal processing, etc.) is used in semiconductor manufacturing for a variety of applications, including for activating dopants in select regions of devices (structures) formed in a semiconductor wafer when forming active microcircuits such as transistors and related types of semiconductor features.

One type of laser annealing involves the formation of a line-shaped intensity profile that is scanned over the semiconductor wafer by moving the line image, moving the semiconductor wafer, or a combination of these two movements. The line image is scanned in a "scan direction," which is perpendicular to its long axis. Some spatial variation in the intensity in the line image along the scan direction (i.e., the short axis of the line image) can be tolerated since the non-uniformities are averaged out as the line image moves over the semiconductor wafer. On the other hand, the spatial variation of the intensity profile in the "cross-scan" direction of the line image needs to be tightly controlled to achieve consistent annealing results over the scan path of the line image.

In forming the line image, a pulsed laser beam that has a Gaussian intensity profile needs to be shaped into a flat-top or super-Gaussian intensity profile. This can be done through beam homogenization, which can be performed using a micro-lens array or a light pipe to divide the incident beam into multiple wavelets and then recombining the wavelets. The overlap of the multiple wavelets creates a macroscopically uniform beam. However, when the laser beam is coherent, there can still be micro-scale beam profile non-uniformities due to interference effects, such as speckle.

FIG. 1A is a plot of an example prior art intensity profile I(x) versus x for an example line image formed at an image plane where a wafer surface is located. The plot of FIG. 1A schematically illustrates example micro-scale intensity variations $I_m(x)$ that can be seen when the intensity profile is viewed at small scales, i.e., with a range typically between a fraction of a micron to tens of microns, as compared to macro-scale variations, which are measured in the range from about one millimeter to tens of millimeters. These micro-scale intensity variations are difficult to mitigate, especially when short light pulses are used in the annealing process.

SUMMARY

Systems and methods for reducing pulsed laser beam profile non-uniformities for laser annealing are disclosed. The methods include directing a first or initial pulsed laser beam along an optical axis, and imparting to each light pulse a time-varying angular deflection relative to the optical axis. This forms a new (i.e., deflected) laser beam wherein each light pulse is smeared out over an amount of spatial deflection δ sufficient to reduce the micro-scale intensity variations in the laser beam. The new (deflected) laser beam is then used to form the line image, which has better intensity uniformity (i.e., less micro-scale intensity variations) as compared using the initial laser beam to form the line image.

An aspect of the disclosure is a method of reducing micro-scale intensity variations when forming a line image used to perform laser annealing of a semiconductor substrate. The method includes: a) directing a laser beam along an optical axis, wherein the laser beam has a wavelength λ and includes light pulses having a temporal pulse length τ in the range from 10 nanoseconds to 10 microseconds; b) imparting to each light pulse a varying angular deflection relative to the optical axis to cause each light pulse to be smeared out over an amount of spatial deflection δ sufficient to reduce the micro-scale intensity variations in the laser beam by a factor of at least 1.5× root-mean square (hereinafter referred to as "RMS") as compared to no angular deflection, and wherein δ≤100 microns; and c) using the laser beam formed in act b) to form the line image.

Another aspect of the disclosure is the method described above, wherein act b) of imparting the varying angular deflection includes either passing the laser beam through or reflecting the laser beam off of a beam-redirecting element.

Another aspect of the disclosure is the method described above, wherein the beam-redirecting element includes either an acousto-optic modulator or an electro-optic modulator.

Another aspect of the disclosure is the method described above, wherein the micro-scale intensity variations have a modulation period $p_s$ in the range $\lambda/4 \leq p_s \leq 40\lambda$, and wherein $\delta \geq p_s$.

Another aspect of the disclosure is the method described above, the micro-scale intensity variations have a modulation period $p_s$ in the range $\lambda/2 \leq p_s \leq 20\lambda$.

Another aspect of the disclosure is the method described above, further including performing beam conditioning of the laser beam either before or after imparting the varying angular deflection to the light pulses in the laser beam.

Another aspect of the disclosure is the method described above, wherein forming the line image includes passing a deflected laser beam through a relay optical system.

Another aspect of the disclosure is the method described above, wherein the micro-scale intensity variations occur in two orthogonal directions, and wherein act b) is performed using a beam-redirecting element that is oriented at an angle relative to the optical axis such that the micro-scale intensity variations are reduced in the two orthogonal directions.

Another aspect of the disclosure is a laser annealing system for annealing a surface of a semiconductor substrate with a line image formed by a laser beam. The system includes: a laser system that emits a laser beam having light pulses, with each light pulse having a wavelength λ and a temporal width τ, and wherein the laser beam includes an intensity profile having a first amount of micro-scale intensity variations with a modulation period $p_s$ in the range from $\lambda/4$ to $40\lambda$; a beam-redirecting element arranged to receive the light pulses and for each light pulse causes a time-varying amount of spatial deflection $\delta$ of the laser beam, wherein $p_s \leq \delta \leq 100$ µm, thereby forming a deflected light beam with a second amount of micro-scale intensity variations that is less than the first amount of micro-scale intensity variations; a relay optical system configured to receive the deflected light beam and form therefrom the line image at an image plane where the surface of the semiconductor substrate resides; and a controller operably connected to the beam-redirecting element and to the laser system, the controller configured to synchronize the emission of the light pulses from the laser system with the operation of the beam-redirecting element to perform said time-varying amount of spatial deflection $\delta$ for each light pulse.

Another aspect of the disclosure is the laser annealing system described above, wherein the beam-redirecting element includes an acousto-optic deflector or an electro-optic deflector.

Another aspect of the disclosure is the laser annealing system described above, wherein the micro-scale intensity variations of the first amount have a modulation period $p_s$ in the range $\lambda/2 \leq p_s \leq 20\lambda$.

Another aspect of the disclosure is the laser annealing system described above, wherein the relay optical system has a 1:1 magnification.

Another aspect of the disclosure is the laser annealing system described above, wherein $\lambda = 532$ nm.

Another aspect of the disclosure is the laser annealing system described above, and further including a knife-edge aperture through which the deflected light beam passes and that defines a length of the line image.

Another aspect of the disclosure is the laser annealing system described above, wherein the second amount of micro-scale intensity variations is less than the first amount of micro-scale intensity variations by a factor of at least 1.5× RMS.

Another aspect of the disclosure is a method of reducing micro-scale intensity variations in a laser beam used for laser annealing of a semiconductor wafer. The method includes: generating from a laser source a laser beam having a wavelength $\lambda$ and including light pulses, wherein the laser beam has an amount of the micro-scale intensity variations with a modulation period $p_s$ between $\lambda/4$ and $40\lambda$; imparting a time-varying spatial deflection $\delta$ to each light pulse to form a deflected light beam by passing each light pulse through a beam-redirecting element that is activated in synchrony with the laser source, wherein $p_s \leq \delta$; and forming from the deflected light beam a line image at an image plane.

Another aspect of the disclosure is the method described above, wherein $\delta \leq 100$ µm.

Another aspect of the disclosure is the method described above, wherein forming the line image includes passing the deflected light beam through a knife-edge aperture while imaging the knife-edge aperture onto the image plane with a relay optical system.

Another aspect of the disclosure is the method described above, wherein the micro-scale intensity variations have RMS value, and wherein the RMS value of the micro-scale intensity variations in the deflected light beam as measured at the knife-edge aperture is decreased by at least a factor of between 1.5× and 5× as compared to an undeflected laser beam as measured at the knife-edge aperture.

Another aspect of the disclosure is the method described above, wherein the light pulses have a repetition rate of $f_{rep}$, and wherein imparting the time-varying spatial deflection $\delta$ includes driving the beam-redirecting element at a repetition rate $f_{a\_rep}$ that is equal to or a harmonic of the repetition rate of the light pulses.

Another aspect of the disclosure is the method described above, wherein the beam-redirecting element is either acoustic-based or electro-optic based.

Another aspect of the disclosure is a method of reducing micro-scale intensity variations when performing laser annealing of a semiconductor wafer with a line image. The method includes: directing along an optical axis a first laser beam having light pulses and first micro-scale intensity variations; imparting to each light pulse in the first laser beam a time-varying angular deflection relative to the optical axis, thereby smearing out each light pulse over an amount of spatial deflection $\delta$ to form a second laser beam having second micro-scale intensity variations that are less than the first micro-scale intensity variations; and using the second laser beam to form the line image.

Another aspect of the disclosure is the method as described above, wherein the first micro-scale intensity variations have a root-mean square (RMS) value, and wherein the RMS value of the micro-scale intensity variations in the second laser beam is decreased by at least a factor of between 1.5× and 5× as compared to the first laser beam.

Another aspect of the disclosure is the method described above, wherein the micro-scale intensity variations have a modulation period $p_s$, and wherein $p_s \leq \delta$.

Another aspect of the disclosure is the method described above, wherein the first laser beam has a wavelength $\lambda$ and $\lambda/4 \leq p_s \leq 40\lambda$.

Another aspect of the disclosure is the method described above, wherein $\delta \leq 100$ µm.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary and are intended to provide an overview or framework to understand the nature and character of the claims.

BRIEF DESCRIPTION OF THE DRAWINGS

The accompanying drawings are included to provide a further understanding and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIGS. 5A through 5C are timing plots that shows the timing of light pulses with respect to the operation of the acoustic-based beam-redirecting element of FIG. 4, wherein FIG. 5A is a plot of the light pulse intensity $I_p$ as a function of time t, and FIGS. 5B and 5C are two example plots of the VCO (Voltage Controlled Oscillator) input voltage Vco or the deflection angle $\Delta\theta_a$ (arbitrary units) versus time t;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute a part of this Detailed Description.

Cartesian coordinates are shown in some of the Figures for the sake of reference and are not intended to be limiting as to direction or orientation.

In the discussion below, the parameter $p_s$ is used to denote the period of the micro-scale intensity variations in the laser beam profile. The frequency of the micro-scale intensity variations is $f_s$ and is given by $f_s=1/p_s$. The micro-scale intensity variations occur over a range of periods $p_s$ and spatial frequencies $f_s$, which in an example can be deduced using Fourier methods as are known in the art (e.g., to obtain a frequency spectrum). In an example, the range of periods $p_s$ over which the micro-scale intensity variations are substantially reduced is $\lambda/4 \leq p_s \leq 40\lambda$, or alternatively, $\lambda/2 \leq p_s \leq 20\lambda$, where $\lambda$ is the wavelength of the laser beam used. In an example below, a sinusoidal micro-scale intensity variation having a single period $p_s$ is discussed for the sake of illustration.

Also in the discussion below, the reduction factor FR is a measure of how much the micro-scale intensity variations are reduced by implementing the beam-redirecting methods disclosed herein. In one example discussed below, an example reduction factor FR is deduced mathematically from the aforementioned single-period example for the micro-scale intensity variation, and is expressed as an "inverse" reduction factor FR'=1/FR. More generally, the reduction factor FR is simply a measure of how much the micro-scale intensity variations are reduced. In one example, the reduction factor FR is measured based on RMS measurements of the "before" and "after" intensity profiles, i.e., without spatial deflection and with spatial deflection, respectively. Thus, where the RMS micro-scale intensity variations without and with spatial deflection are given by $I_{m-RMS}$ and $I'_{m-RMS}$ respectively, then in an example the reduction factor FR is given by $FR=(I_{m-RMS})/(I'_{m-RMS})$.

Laser Annealing System with Beam-redirection Element

Figure 2:
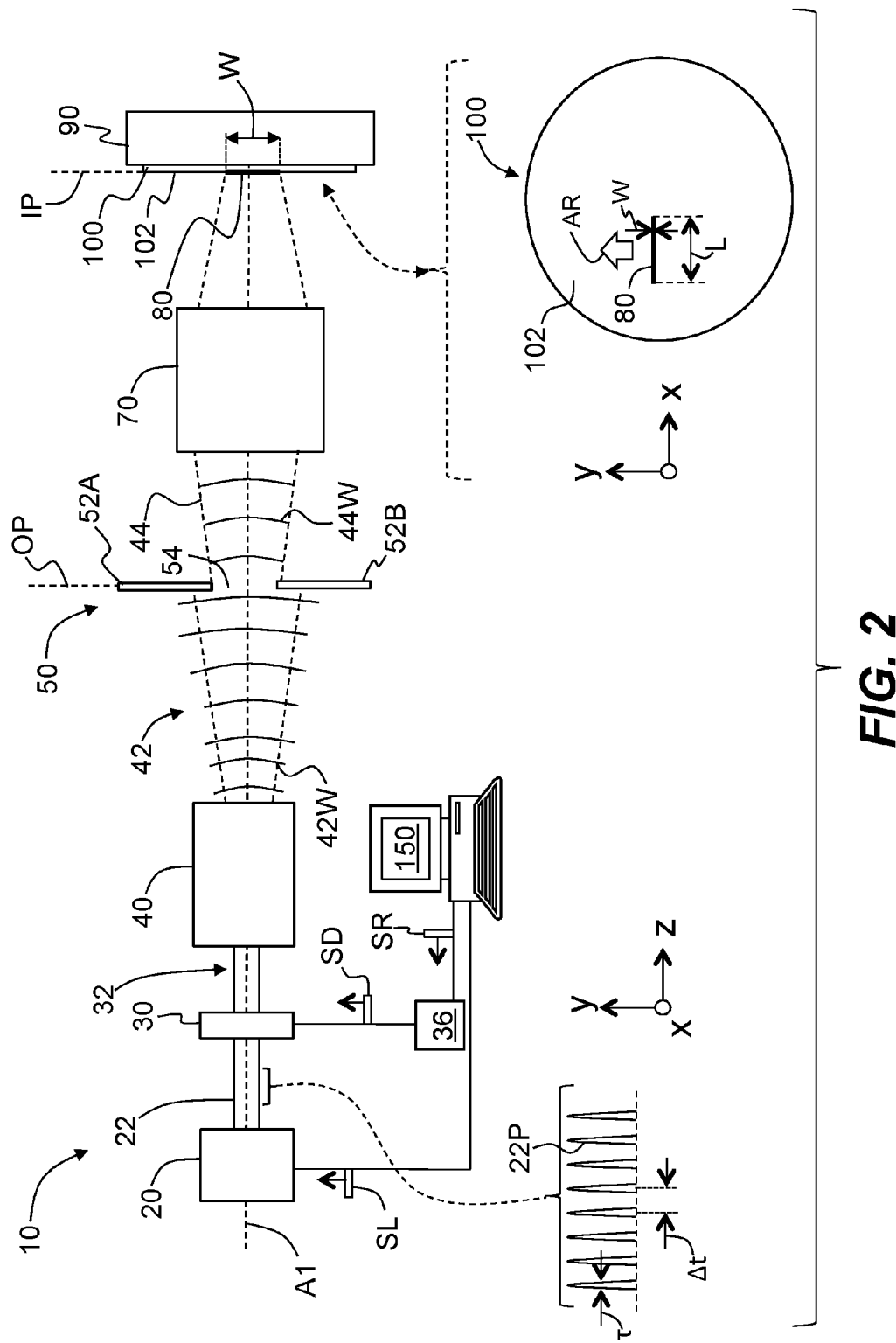
FIG. 2 is a schematic diagram of an example laser annealing system that includes the beam-redirecting element used to reduce non-uniformities in the profile of the pulsed laser beam used for annealing a semiconductor wafer.

FIG. 2 is a schematic diagram of an example of a laser annealing system 10 according to the disclosure. The laser annealing system 10 is shown as unfolded for ease of illustration, i.e., as having a single optical axis A1. In practice, the laser annealing system 10 is typically folded, as described below, to make the laser annealing system 10 compact while providing the proper beam orientations. For example, it is desirable to form the line image at an incident angle at or near the Brewster angle to minimize reflection.

The laser annealing system 10 includes a laser system 20 that emits an initial laser beam 22 along the optical axis A1. In an example, the laser system 20 includes an infrared (hereinafter referred to as "IR") laser, such as a $CO_2$ laser that emits radiation at a wavelength of nominally 10.6 μm. Other suitable lasers include mid-infrared fiber lasers, such as a thulium laser. An example laser system 20 emits light having a wavelength $\lambda$=532 nm. The initial laser beam 22 is made up of light pulses 22P that in an example have a temporal pulse width τ in the range from 10 ns to 10 μs and a pulse spacing Δt in the range from 20 microseconds to 10 milliseconds, which represents a range on the laser pulse frequency (or repetition rate) $f_{rep}=1/\Delta t$ of 0.1 kHz$\leq f \leq$50 kHz, with 10 kHz being an exemplary value for the laser pulse frequency $f_{rep}$.

The laser annealing system 10 also includes a beam-redirecting element 30 arranged along the optical axis A1 to receive the initial laser beam 22 and light pulses 22P. The beam-redirecting element 30 is operably connected to a drive unit or "driver" 36 that activates or "drives" the beam-redirecting element 30 via a drive signal SD. The beam-redirecting element 30 is configured to cause a slight deflection in the optical path of the initial laser beam 22, wherein the amount of the deflection varies within the temporal pulse width τ of each pulse. This beam-deflecting operation is discussed in greater detail below. Examples of beam-redirecting element 30 include an acousto-optic deflector (hereinafter referred to as "AOD") such as an acousto-optic modulator (hereinafter referred to as "AOM")

or an electro-optic deflector (hereinafter referred to as "EOD") such as an electro-optic modulator. The output from the beam-redirecting element 30 is a redirected laser beam 32. The beam-redirecting element 30 can also called a "beam-deflecting element."

Other examples of beam-redirecting element 30 include rotating mirrors or scanning (oscillating) mirrors, as discussed below. The advantages of using an acousto-optic-based or electro-optic-based beam-redirecting element over other types of beam-redirecting elements include the fast speed, good reliability, and the absence of moving parts.

The laser annealing system 10 also includes a beam-conditioning system 40 arranged downstream of the beam-redirecting element 30. The beam-conditioning system 40 can include one or more beam-conditioning elements, such as lenses, mirrors, apertures, filters, active optical elements (e.g., variable attenuators, etc.), light pipes, micro-lens arrays, and combinations thereof. The beam-conditioning system 40 receives the redirected laser beam 32 and forms therefrom a redirected conditioned beam 42, which in an example is shown as being divergent and having wavefronts 42W. Example beam-conditioning systems 40 are disclosed in U.S. Pat. Nos. 7,514,305, 7,494,942, 7,399,945, 6,366,308 and 8,014,427.

The laser annealing system 10 further includes an aperture 50. In an example, the aperture 50 includes two opposing adjustable blades 52A and 52B that define an adjustable opening 54 of width W centered on the optical axis A1. The aperture 50 is thus referred to hereinafter as "knife-edge aperture" 50. The knife-edge aperture 50 serves to pass only a portion 44 of redirected conditioned beam 42. Stated differently, a portion of redirected conditioned wavefronts 42W is passed by the knife-edge aperture 50, and these passed wavefronts are denoted 44W. In an example, the blades 52A and 52B are adjustable (e.g., laterally movable) to change the size of opening 54.

The laser annealing system 10 further includes a relay optical system 70 that is arranged along the optical axis A1 and that has an object plane OP and an image plane IP. The knife-edge aperture 50 is arranged at the object plane OP. The relay optical system 70 receives the portion 44 of redirected conditioned beam 42 that passes through the knife-edge aperture 50 and is configured to form a line image 80 at the image plane IP. The size (length) of line image 80 is L, i.e., the size of opening 54 of knife-edge aperture 50 when the relay optical system 70 has a magnification of 1× (i.e., is a 1:1 relay optical system). A typical length L of line image 80 is in the range from 5 mm to 100 mm, while a typical width W is in the range from 25 microns to 500 microns.

The laser annealing system 10 further includes a support stage 90 configured to operably support a semiconductor wafer 100 that has an upper surface 102, which resides in the image plane IP. In an example, the semiconductor wafer 100 is made of silicon.

The support stage 90 is movable so that the line image 80 scans over the upper surface 102 of semiconductor wafer 100 in a direction perpendicular to its long axis (i.e., in the y-direction), as shown in the close-up inset view of semiconductor wafer 100. This direction is referred to as the "scan direction," while the perpendicular direction is referred to as the "cross-scan direction." Using the coordinate system of the close-up inset, the line image 80 has an intensity $I_L(x,y)$. However, the intensity variation in the cross-scan or x-direction is the main interest, so the line-image intensity profile is denoted as $I_L(x)$.

In an example embodiment, the support stage 90 is moved so that the semiconductor wafer 100 moves relative to the line image 80 such that the line image 80 scans over the upper surface 102 of semiconductor wafer 100 as indicated by scan arrow AR.

The laser annealing system 10 includes a controller 150 that is operably connected to the beam-redirecting element 30 and laser system 20 and is configured to coordinate the emission of light pulses 22P with the operation (activation) of the beam-redirecting element 30 to cause a varying deflection in the optical path of each light pulse 22P.

In an example, the controller 150 is programmable to perform the beam-redirecting function described herein. As used herein, the term "controller" broadly refers to computers, processors, microcontrollers, microcomputers, programmable logic controllers, application-specific integrated circuits and other programmable circuits. In an example, the controller 150 executes instructions embodied in a non-transient computer-readable medium that cause the controller 150 to control the movement of beam-redirecting element 30 with respect to the emission of light pulses 22P from the laser system 20.

In an example, the laser system 20 is controlled by a laser control signal SL while the beam-redirecting element 30 is controlled by a control signal SR send to the driver 36, which causes the driver 36 to activate the beam-redirecting element 30 via the drive signal SD. The generation of the laser control signal SL and the control signal SR for the beam-redirecting element 30 is synchronized so that the beam-redirecting element 30 is active while a light pulse 22P is traveling therethrough.

It is also noted that although the beam-redirecting element 30 is shown and discussed herein as being arranged upstream of the beam-conditioning system 40, the beam-redirecting element 30 can also be placed downstream of the beam-conditioning system 40 and still accomplish its function of reducing or elimination the small variations in intensity in the portion 44 of redirected conditioned beam 42 and thus in the final line image 80 formed at the image plane IP.

Other Example Laser Annealing Systems with Beam-redirecting Elements

Figure 3A:
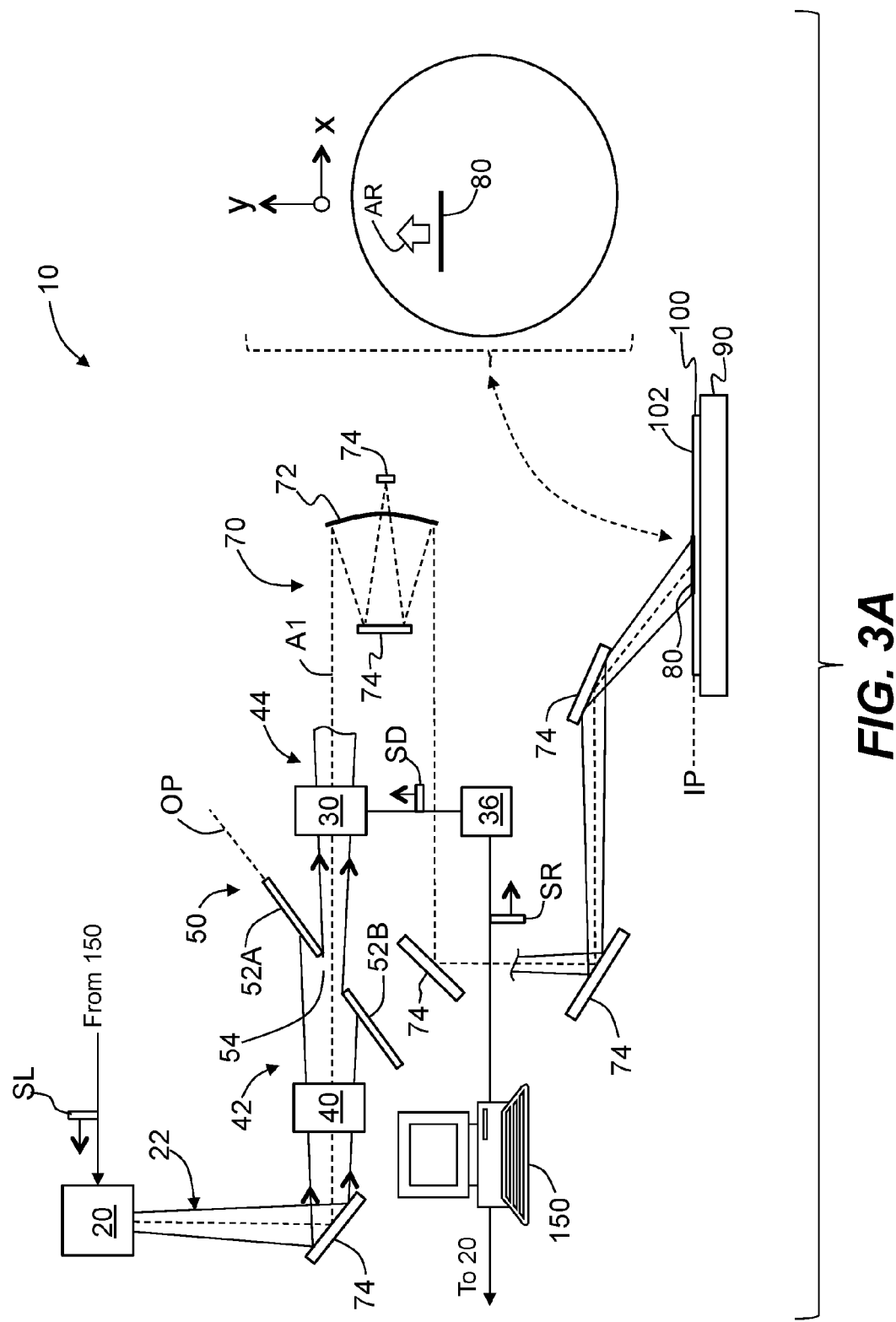
FIG. 3A is a schematic diagram of example laser annealing systems similar to that shown in FIG. 2 but that include more details of the optical system and that also illustrates an embodiment in which the beam-redirecting element resides downstream of the beam homogenizer.
Figure 3B:
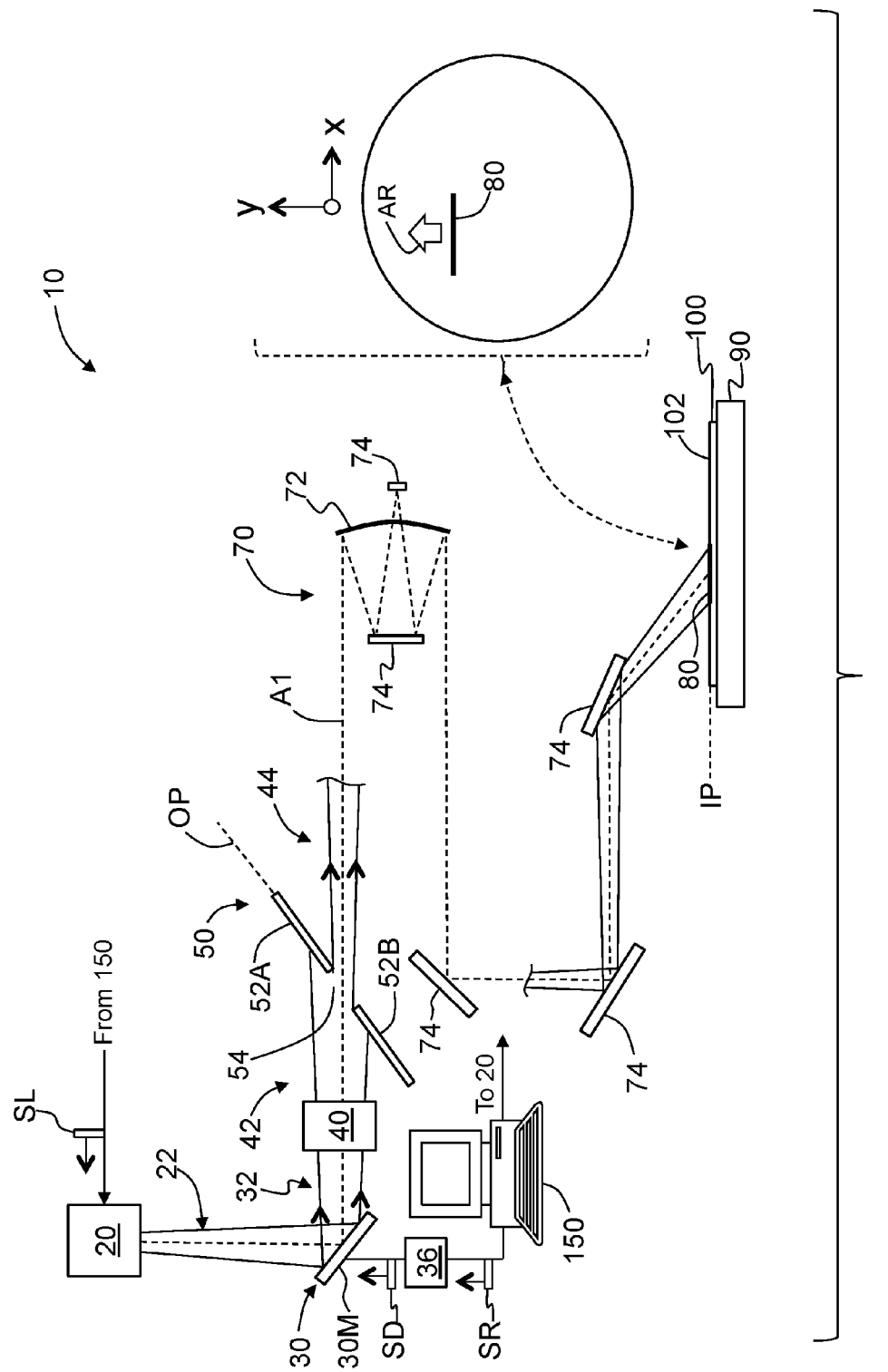
FIGS. 3B and 3C are schematic diagrams of example laser annealing systems similar to that shown in FIG. 3A but that illustrate examples of mirror-based beam-redirecting elements.
Figure 3C:
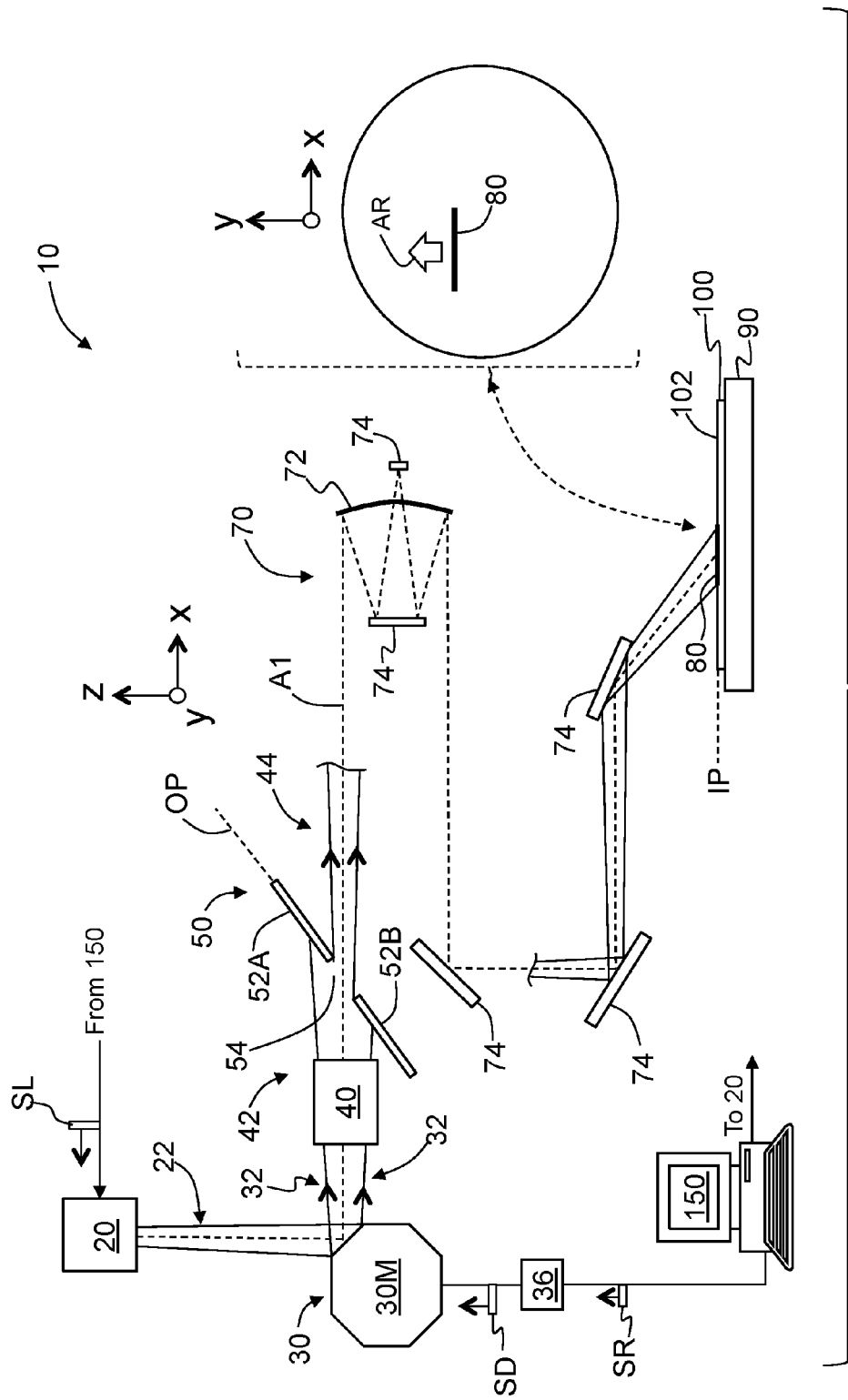

FIG. 3A is a more detailed schematic diagram of another example laser annealing system 10 wherein the optical axis A1 is folded using a number of different fold mirrors 74, and also illustrates an example in which the beam-redirecting element 30 resides downstream of the beam homogenizer as a beam-conditioning system 40. FIGS. 3B and 3C are similar to FIG. 3A but illustrate examples wherein the beam-redirecting element 30 is mirror-based.

In FIG. 3B, the beam-redirecting element 30 comprises a mirror 30M that can oscillate so that a redirected conditioned beam 42 is scanned relative to the knife-edge aperture 50. The relay optical system 70 is shown as including a concave mirror 72 and a number of fold mirrors 74 that direct the portion 44 of redirected conditioned beam 42 to the upper surface 102 of semiconductor wafer 100 at an angle relatively to normal incidence. In an example, the relay optical system 70 is a catoptric system, i.e., includes only mirrors. The object plane OP and knife-edge aperture 50 are shown at an angle relative to the optical axis A1 since the image plane IP and upper surface 102 of semiconductor wafer 100 also form an angle with the optical axis A1.

FIG. 3C is the same as FIG. 3B, except that the mirror 30M is a multifaceted mirror that can rapidly rotate about its rotation axis.

Figure 4:
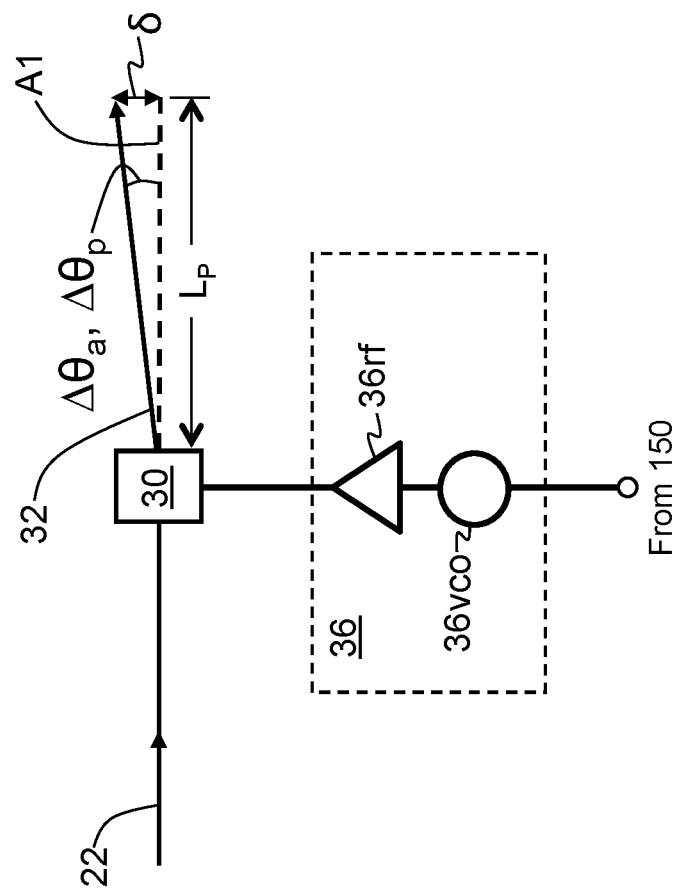
FIG. 4 is a close-up schematic diagram of an example drive unit for an acoustic-based beam-redirecting element showing how the laser beam is deflected or redirected relative to the optical axis.

FIG. 4 is a close-up view of an example beam-redirecting element 30 in the form of an AOD, wherein the driver 36 includes voltage controlled oscillator (hereinafter referred to as "VCO") 36vco and a radio-frequency (hereinafter referred to as "RF") amplifier 36rf. The initial laser beam 22 is deflected by the AOD beam-redirecting element 30 by a deflection angle $\Delta\theta_a = \lambda \cdot \Delta f_a / V_a$, where $\lambda$ is the wavelength of initial laser beam 22, $\Delta f_a$ is the RF modulation bandwidth of the RF amplifier 36rf, and $V_a$ is the acoustic velocity of the AOD beam-redirecting element 30. The deflection angle $\Delta\theta_a$ is thus proportional to the RF frequency modulation, which in turn is proportional to the variation of the VCO input voltage $V_{CO}$ embodied by the control signal SR.

Timing Plots

Figure 5:
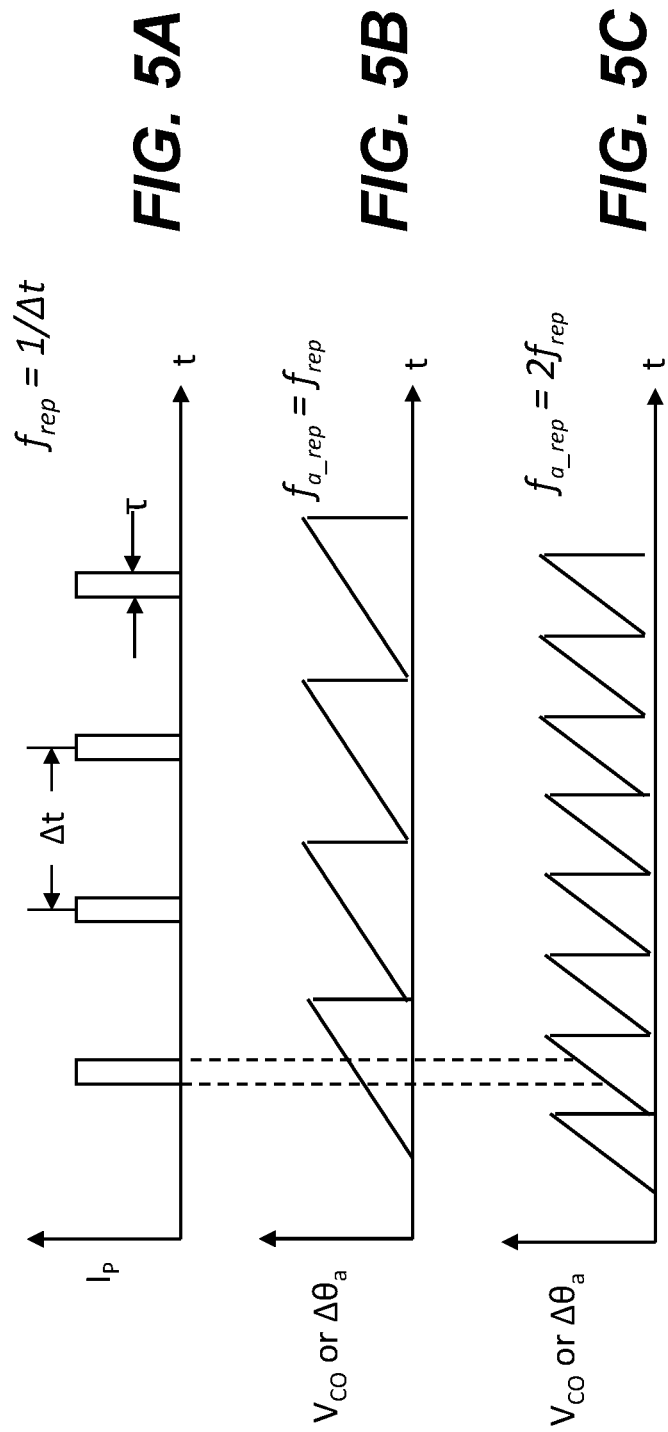

FIGS. 5A through 5C are timing plots that shows the timing of light pulses 22P with respect to the operation of the AOD beam-redirecting element 30. FIG. 5A is a plot of the light pulse intensity $I_p$ as a function of time t. FIGS. 5B and 5C are plots of the VCO input voltage $V_{CO}$ or the deflection angle $\Delta\theta_a$ (arbitrary units) versus time t. Note that within the time duration (i.e., the temporal pulse width) $\tau$ of a given pulse, the deflection angle $\Delta\theta_a$ changes as the VCO input voltage Vco changes. This change in the deflection angle $\Delta\theta_a$ during the light pulse 22P represents a time-varying deflection of initial laser beam 22 as the light beam passes through the AOD beam-redirecting element 30. This slight deflection during the pulse duration serves to smear the initial laser beam 22 over an amount of spatial deflection $\delta$ (measured with respect to the optical axis A1) based on the time-varying deflection angle $\Delta\theta_a$. This smearing serves to smooth out the micro-scale intensity variations in the intensity profile of the initial laser beam 22 that would otherwise result in intensity non-uniformities in line image 80.

Figure 1A:
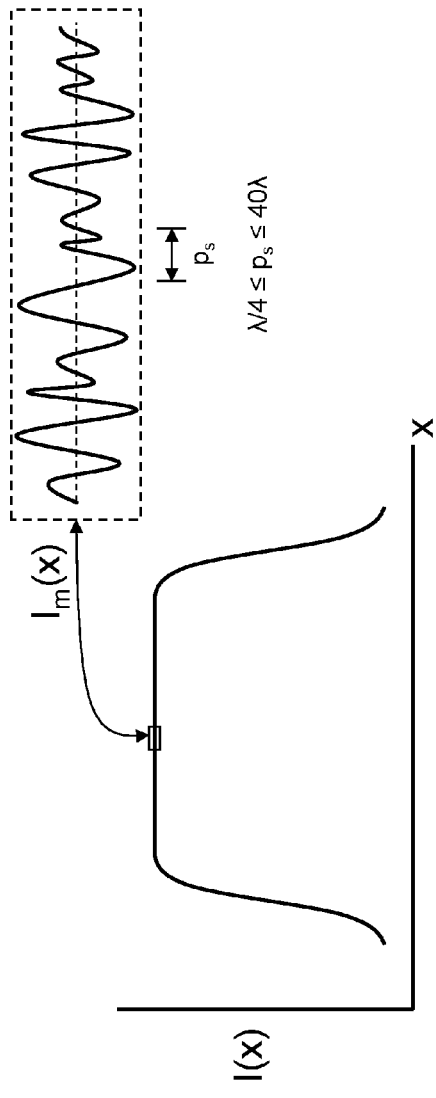
FIG. 1A is a schematic intensity profile plot of an example laser beam used to form a line image in a laser annealing system, wherein the close-up inset shows micro-scale intensity variations $I_m(x)$ caused by interference effects.
Figure 1B:
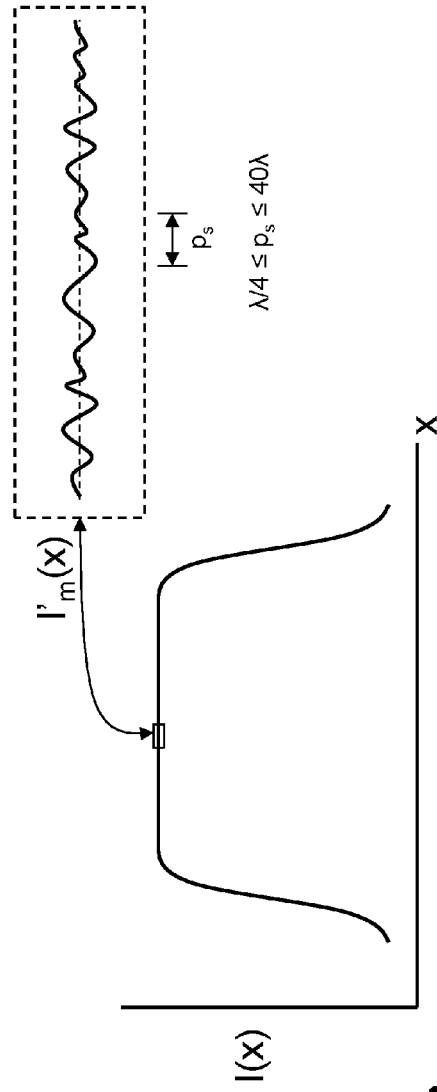
FIG. 1B is similar to FIG. 1A, but shows how the micro-scale intensity variations $I'_m(x)$ are greatly reduced using the beam re-directing systems and methods disclosed herein.

FIG. 1B is similar to FIG. 1A and schematically illustrates this effect, wherein the reduced micro-scale intensity variations are denoted $I'_m(x)$. In an example, the amount of reduction in the micro-scale intensity variations from $I_m(x)$ to $I'_m(x)$ (i.e., the reduction factor FR) is between 1.5× and 5×, with 3× being an exemplary reduction factor. As discussed above, in an example, the reduction factor FR is measured on an RMS basis over a given range of modulation periods $p_s$, such as the aforementioned range of $\lambda/4 \leq p_s \leq 40\lambda$.

With reference to FIGS. 5A through 5C, the light pulses 22P have repetition rate (or laser pulse frequency) off $f_{rep}$, and the VCO input voltage $V_{CO}$ (and hence the AOD deflection angle $\Delta\theta_a$) is swept by a saw tooth waveform at a repetition rate off $f_{a\_rep}$. The repetition rate $f_{a\_rep}$ can be the same as or a harmonic of the laser pulse frequency $f_{rep}$ to ensure that same amount of deflection angle $\Delta\theta_p$ per pulse is achieved during each light pulse 22P. The per-pulse deflection angle $\Delta\theta_P$ is given by $\Delta\theta_P = \Delta\theta_a \cdot f_{a\_rep} \cdot \tau$. The maximum value of repetition rate $f_{a\_rep}$ is defined by $f_{a\_rep} < [t_R + \tau]^{-1}$, where $t_R$ is the rise time of the AOD beam-redirecting element 30, i.e., the time needed for the acoustic wave to propagate through the optical aperture 50 of the AOD.

Light Pulse Deflection

Figure 6:
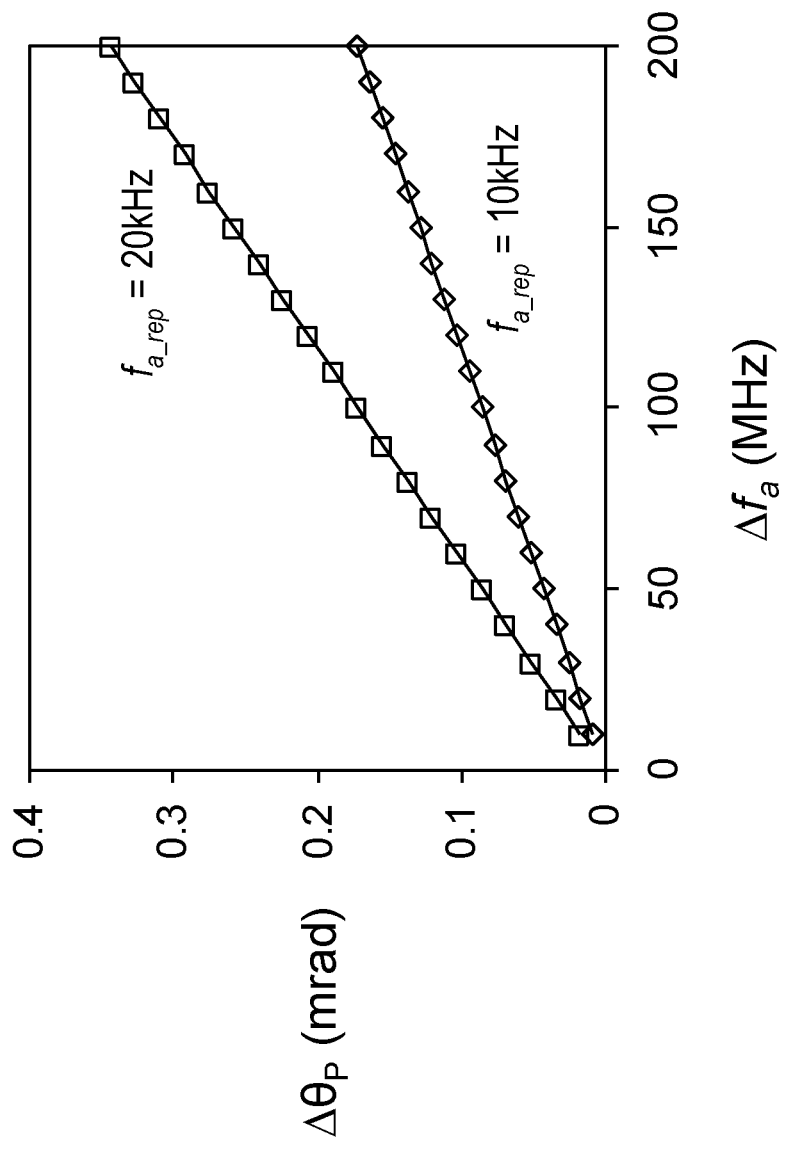
FIG. 6 is a plot of the estimated pulse deflection angle $\Delta\theta_P$ (mrad) versus the RF modulation bandwidth $\Delta f_a$ (MHz) of the driver for the acoustic-based beam-redirecting element, wherein the plot shows the deflection during a single light pulse for two exemplary values of the repetition rate off $f_{a\_rep}$ of the acoustic-based beam-redirecting element of 10 kHz and 20 kHz.

FIG. 6 is a plot of the estimated (maximum) pulse deflection angle $\Delta\theta_P$ (mrad) versus the RF modulation bandwidth $\Delta f_a$ (MHz) that shows the deflection during a single light pulse 22P for two exemplary values of the repetition rate of $f_{a\_rep}$ of 10 kHz and 20 kHz. In this example, a $TeO_2$ shear wave AOD is used that has an acoustic-wave velocity of $V_a$=617 m/s. Other parameters used for the calculations are $\lambda$=0.53 μm and $\tau$=100 ns. The pulse deflection angle $\Delta\theta_P$ for a given pulse is a function of time t (i.e., is time-varying), with the maximum deflection angle $\Delta\theta_a$ being only a fraction of a milliradian (mrad).

For such a small deflection angle $\Delta\theta_a$, the small-angle approximation can be used so that the spatial deflection $\delta$ is given by $\delta = L_p \cdot \Delta\theta_p$, where $L_P$ is the length of the optical path over which the deflection occurs (i.e., the optical path length), and where $\Delta\theta_P$ is measured in radians (see FIG. 4). Note that because the pulse deflection angle $\Delta\theta_P(t)$ is time-varying, the spatial deflection $\delta$ is time-varying, i.e., $\delta(t)$. This time-variation in the spatial deflection corresponds to the aforementioned smearing of the light beam intensity profile as the redirected laser beam 32 sweeps over the range of pulse deflection angles $\Delta\theta_P(t)$. In an example, the optical path length $L_P$ is defined by the axial distance between the beam-redirecting element 30 and the downstream optical component or system. In an example, the downstream optical component or system is beam-conditioning system 40 or relay optical system 70.

By way of example, for a 200 mm optical path length $L_P$, the spatial deflection $\delta$ has a maximum extent of about $\delta \sim (200 \text{ mm}) \cdot (0.2 \times 10^{-3} \text{ rads}) = 0.040$ mm, or 40 microns. In an example, the maximum spatial deflection $\delta$ can be in the range from about 10 microns to about 100 microns or in another example from 20 to 60 microns. This amount of spatial deflection $\delta$ does not substantially affect annealing performance. Yet, the small amount of spatial deflection $\delta$ provide sufficient smearing to serve to average out microscopic intensity non-uniformities in the redirected (i.e., deflected) laser beam 32 and thus in the line image 80. In an example embodiment, the degree of improvement in uniformity (i.e., the reduction in the modulation of the micro-scale intensity variations) can be measured by comparing the root-mean square (RMS) micro-scale intensity variation $I_{m-RMS}(x)$ of the redirected laser beam 32 and the initial laser beam 22.

Mathematical Explanation of Micro-scale Beam Uniformization

The micro-scale beam intensity uniformization provided by the use of beam-redirecting element 30 in the laser annealing system 10 as described above can be explained in mathematical terms. The mathematical explanation below utilizes a single modulation frequency, i.e., a single spatial variation in the intensity. In practice, there is a range of modulation frequencies in the intensity profile. But the underlying principle behind the reduction in the micro-scale intensity variations can be understood using this simplified approach.

To this end, and without intending to be limited by the basic mathematical treatment below being provided for ease of understanding, consider an averaged beam profile intensity $I_a(x)$, which can be calculated as follows:

$$I_a(x) = \int P(t) I(x - V_s t) dt.$$

The function I(x) is the original intensity profile without any spatial deflection $\delta$, $V_s$ is the beam-shifting velocity (such as provided by acoustic waves of an acoustic-based beam-redirecting element 30). The function P(t) is the normalized temporal profile of the light pulse 22P that satisfies the following condition:

$$\int P(t) dt = 1$$

In a simple example where I(x) is modulated by a sinusoidal function with a micro-scale spatial modulation period of $p_s$ and an intensity "amplitude" $I_1$, and where P(t) follows a Gaussian profile, then:

$$I(x) = I_0 + I_1 \cos\left(\frac{2\pi}{p_s} x\right)$$

-continued $$P(t) = \frac{1}{\sqrt{2\pi}\,\sigma_t}\exp\left[-\frac{(t-t_0)^2}{2\sigma_t^2}\right]$$

$$I_a(x) = I_0 + I_1\cos\left(\frac{2\pi}{p_s}x\right)\exp\left[-\frac{\pi^2}{4\ln2}\left(\frac{\delta}{p_s}\right)^2\right]$$

where at $\sigma_t = t_p/\sqrt{8\ln2}$ and where $t_p$ is the full-width-half-maximum of the Gaussian profile, and $\delta = V_s \cdot t_p$ is the beam shift during a single light pulse 22P. In this case, the intensity modulation will be reduced exponentially as a function of the spatial deflection $\delta$. The above equation for $I_a(x)$ can be used to define a dimensionless micro-scale intensity variation inverse reduction factor FR' that is a function of $\delta/p_s$:

$$FR' = \exp\left[-\frac{\pi^2}{4\ln2}\left(\frac{\delta}{p_s}\right)^2\right]$$

Figure 7:
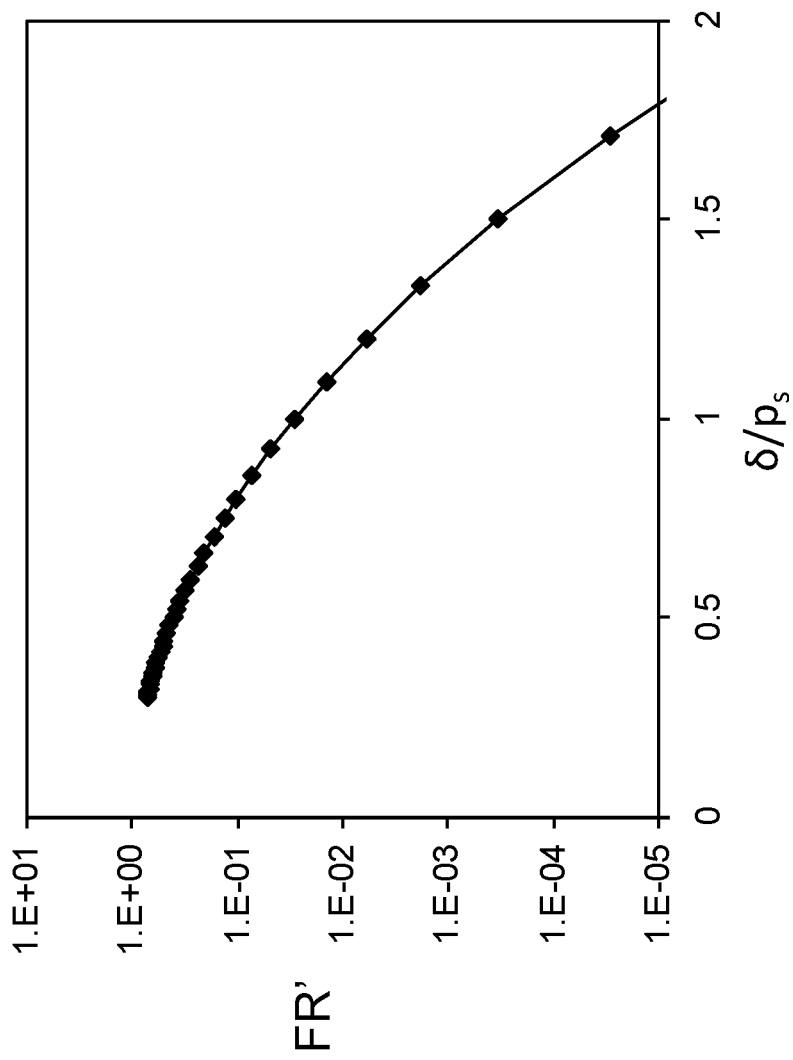
FIG. 7 is a plot of the inverse reduction factor FR' vs. $\delta/p_s$, where $\delta$ is the amount of spatial deflection and $p_s$ is the modulation period of the example sinusoidal micro-scale intensity modulation.

FIG. 7 is a plot of the inverse reduction factor FR' vs. $\delta/p_s$. It can be seen that to smooth out the modulation effectively, the amount of spatial deflection $\delta$ needs to be at least of order of the modulation period of the micro-scale intensity variations, e.g., $\delta \geq p_s$. Note that the inverse reduction factor FR' is the inverse of the above-described reduction factor FR. Also note that the size of the inverse reduction factor FR' for values of $\delta/p_s > 1$ is quite small (i.e., large reduction), e.g., smaller than 0.003 for $\delta/p_s > 1.5$ (i.e., FR>1000). This large value is due to the simplified treatment of the micro-scale intensity variation that uses a single value of the modulation period $p_s$. In practice, the smoothing out or averaging process occurs over the range of modulation periods $p_s$, which reduces the reduction factor FR (or increases the inverse reduction factor FR').

Thus, in an example where the modulation period $p_s$ is in the range from $\lambda/4$ to $40\lambda$, the spatial deflection $\delta$ can be in the same range, or can have a larger range, as long as the condition $\delta \geq p_s$ is met. In an example, an upper limit on the spatial deflection $\delta$ is 100 microns or 0.1 mm, or more preferably 50 microns or 0.05 mm, or even more preferably 25 microns, or 0.025 mm. The upper limit on the spatial deflection $\delta$ is determined by the tolerance on how much line image 80 can be shifted along its length from its nominal (i.e., un-deflected) position while not adversely affecting the given annealing process. In an example, the modulation period $p_s$ is in the range from $\lambda/2$ to $20\lambda$, which for $\lambda=532$ nm is from about 0.25 micron to about 10 microns.

Two-dimensional Micro-scale Intensity Variations

In the above discussion, one dimensional (1D) modulation is assumed. In practice, the micro-scale intensity variations (modulation) can occur in both x and y dimensions. In an example of laser annealing system 10, two separate beam-redirecting elements 30 can be used, with the beam-redirecting elements 30 configured so that the beam shifts $\delta$ (i.e., $\delta_x$ and $\delta_y$) are orthogonal to each other. This approach adds cost and complexity to the laser annealing system 10, and can also increase the laser beam power loss. In the case of an AOD beam-redirecting element 30, the efficiency is typically around 80%. With two such AOD beam-redirecting elements 30 in the optical path, the power loss increases from 20% to 36%.

An alternative implementation to mitigate the 2D micro-scale intensity variations is to use a single beam-redirecting element 30 and rotate about the optical axis A1 by a finite rotation angle $\varphi$ so that it deflects each light pulse 22P in both the x and y directions. The optimal rotation angle $\varphi$ depends on the actual interference pattern formed. As an example, for the following 2D intensity distribution $I(x,y) \propto \cos^2[2\pi x/p_s]\cdot\cos^2[2\pi y/p_s]$, the optimal rotation angle is about 27 degrees.

Figure 8:
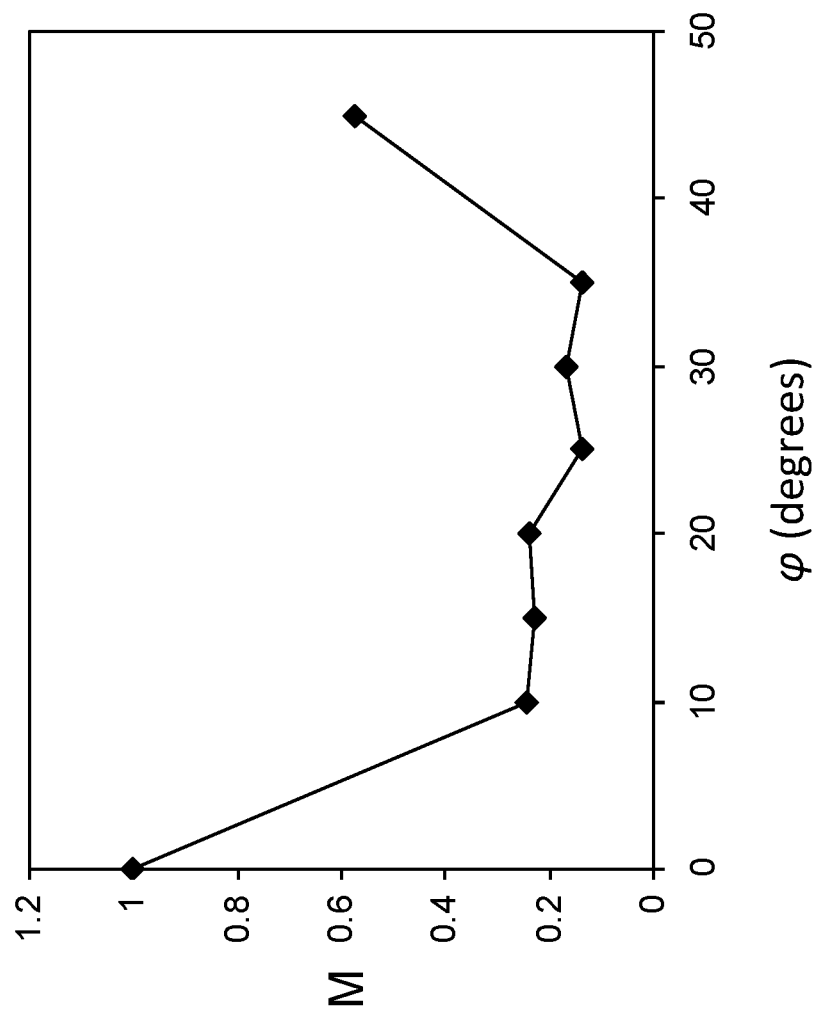
FIG. 8 is a plot of the simulated peak-to-valley intensity modulation M (normalized to no rotation) as a function of rotation angle φ (degrees) for a single beam-redirecting element and an example two-dimensional intensity distribution, showing how the rotation angle can reduce the intensity modulation and hence the amount of non-uniformity in the pulsed laser beam that forms the line image.

FIG. 8 is a plot of the simulated peak-to-valley modulation M (normalized to the modulation value with no rotation) as a function of rotation angle $\varphi$ (degrees) for such hypothetical distribution. There is drastic reduction in the simulated peak-to-valley modulation M with rotation as compared to no rotation. Thus, in an example embodiment, the laser annealing system 10 includes a single beam-redirecting element 30 that is rotated about the optical axis A1 by a rotation angle $\varphi$, which in an example is optimized to minimize the simulated peak-to-valley modulation M, which is one way to characterize the micro-scale intensity variations.

Figure 9:
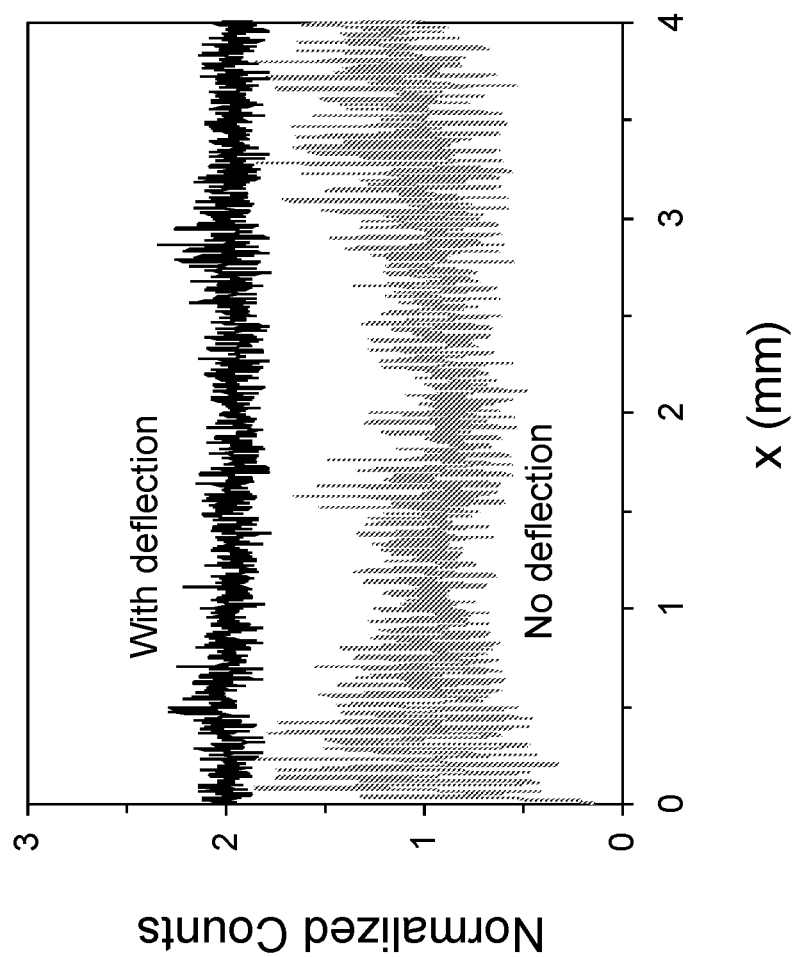
FIG. 9 is a plot of intensity counts (normalized to the average) versus position x (mm) for experimental results obtained for an example laser annealing system according to FIG. 2 for both a deflected light beam (i.e., deflected light pulses) and a non-deflected light beam (i.e., non-deflected light pulses), showing an example reduction in the modulation of the micro-scale intensity variations in the laser beam intensity profile when using the beam-redirecting methods disclosed herein (for clarity, the vertical scale of the profile with spatial deflection is offset by 1).

FIG. 9 is a plot of intensity counts (normalized to the average) versus position (mm) for experimental results obtained for an example laser annealing system 10 according to FIG. 2 for both a deflected laser beam (i.e., deflected light pulses) and a non-deflected laser beam (i.e., non-deflected light pulses). The data for the deflected laser beam is offset by 1 from the no-deflection data for ease of illustration. The AOD beam-redirecting element 30 was an AOM. The AOD (AOM) repetition rate (frequency) $f_{a\_rep}$ and the laser pulse frequency $f_{rep}$ were both 10 kHz. The AOD (AOM) bandwidth $\Delta f_a$ was about 100 MHz. The other system parameters used were similar to those used in connection with the plot of FIG. 6. The intensity counts were taken from a cross-section of the beam profile image captured by a high-resolution CMOS image sensor placed at the image plane IP. The lighter portions of the beam profile image correspond to the non-deflected beam while the darker portions correspond to the deflected beam.

The data show about a 3× reduction in beam intensity modulation. The actual modulation reduction depends on the nature of the interference pattern. As discussed above, a typical interference pattern involves intensity modulation with different spatial periodicities. In general, the reduction will be most effective for the micro-scale intensity variations with periodicities $p_s < \delta$ and less effective for the micro-scale intensity variations with periodicities $p_s > \delta$. As discussed above, a typical modulation reduction in the micro-scale intensity variations is 1.5× or greater, e.g., 2× to 5×. For the non-deflected beam profile shown in FIG. 9, model calculations predict a reduction of about 3× in modulation using spatial deflection $\delta$, which consistent with experimental results.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of reducing micro-scale intensity variations in a laser beam used for laser annealing of a semiconductor wafer, comprising:

generating from a laser source a laser beam having a wavelength $\lambda$ and including light pulses, wherein the laser beam has an amount of the micro-scale intensity variations with a modulation period $p_s$ between $\lambda/4$ and $40\lambda$;

imparting a time-varying spatial deflection $\delta$ to each light pulse to form a deflected light beam by passing each light pulse through a beam-redirecting element that is activated in synchrony with the laser source, wherein $p_s \leq \delta$; and forming from the deflected light beam a line image at an image plane.

2. The method according to claim 1, wherein $\delta \leq 100$ µm.

3. The method according to claim 1, wherein the light pulses have a repetition rate of $f_{rep}$, and wherein imparting the time-varying spatial deflection $\delta$ includes driving the beam-redirecting element at a repetition rate $f_{a\_rep}$ that is equal to or a harmonic of the repetition rate of the light pulses.

4. The method according to claim 1, wherein the beam-redirecting element is either acoustic-based or electro-optic based.

5. The method according to claim 1, wherein the modulation period $p_s$ is between $\lambda/2$ and $20\lambda$.

6. The method according claim 1, further comprising performing beam conditioning of the laser beam either before or after imparting the time-varying spatial deflection $\delta$.

7. The method according to claim 1, wherein forming the line image using the deflected light beam includes passing the second laser beam through a relay optical system.

8. The method according to claim 1, wherein the micro-scale intensity variations occur in two orthogonal directions, wherein the light pulses travel along an optical axis, and wherein the act of imparting the time-varying spatial deflection $\delta$ to each light pulse is performed using the beam-redirecting element that is oriented at an angle relative to the optical axis such that the micro-scale intensity variations are reduced in the two orthogonal directions.

9. The method according to claim 1, wherein forming the line image includes passing the deflected light beam through a knife-edge aperture while imaging the knife-edge aperture onto the image plane with a relay optical system.

10. The method according to claim 9, wherein the micro-scale intensity variations have a root-mean square (RMS) value, and wherein the RMS value of the micro-scale intensity variations in the deflected light beam as measured at the knife-edge aperture is decreased by at least a factor of between 1.5× and 5× as compared to an undeflected laser beam as measured at the knife-edge aperture.

11. A method of reducing micro-scale intensity variations when performing laser annealing of a semiconductor wafer with a line image, comprising:

directing along an optical axis a first laser beam having light pulses and first micro-scale intensity variations;

imparting to each light pulse in the first laser beam a time-varying angular deflection relative to the optical axis, thereby smearing out each light pulse over an amount of spatial deflection $\delta$ to form a second laser beam having second micro-scale intensity variations that are less than the first micro-scale intensity variations; and using the second laser beam to form the line image.

12. The method according to claim 11, wherein the first micro-scale intensity variations have a root-mean square (RMS) value, and wherein the RMS value of the micro-scale intensity variations in the second laser beam is decreased by at least a factor of between 1.5× and 5× as compared to the first laser beam.

13. The method according to claim 11, wherein $\delta \leq 100$ µm.

14. The method according to claim 11, wherein the micro-scale intensity variations in the laser beam are reduced by a factor of at least 1.5× root-mean square (RMS) as compared to no time-varying spatial deflection.

15. The method according claim 11, further comprising performing beam conditioning of the laser beam either before or after imparting the time-varying angular deflection.

16. The method according to claim 11, wherein forming the line image using the second laser beam includes passing the second laser beam through a relay optical system.

17. The method according to claim 11, wherein the micro-scale intensity variations occur in two orthogonal directions, and wherein the act of imparting the time-varying angular deflection to each light pulse is performed using a beam-redirecting element that is oriented at an angle relative to the optical axis such that the micro-scale intensity variations are reduced in the two orthogonal directions.

18. The method according to claim 11, wherein the micro-scale intensity variations in the laser beam are reduced by a factor of at least 1.5× root-mean square (RMS) as compared to no time-varying angular deflection.

19. The method according to claim 11, wherein the first micro-scale intensity variations have a modulation period $p_s$, and wherein $p_s \leq \delta$.

20. The method according to claim 19, wherein the first laser beam has a wavelength $\lambda$ and $\lambda/4 \leq p_s \leq 40\lambda$.

21. The method according to claim 20, wherein $\lambda/2 \leq p_s \leq 20\lambda$.

* * * * *